(12) United States Patent
Zhou et al.

(10) Patent No.: US 10,361,631 B2
(45) Date of Patent: Jul. 23, 2019

(54) SYMMETRICAL POWER STAGES FOR HIGH POWER INTEGRATED CIRCUITS

(71) Applicant: Monolithic Power Systems, Inc., San Jose, CA (US)

(72) Inventors: Jinghai Zhou, Cupertino, CA (US); Chia-Hsin Chang, San Jose, CA (US)

(73) Assignee: MONOLITHIC POWER SYSTEMS, INC., San Jose, CA (US)

(*) Notice: Subject to any disclaimer, the term of this patent is extended or adjusted under 35 U.S.C. 154(b) by 58 days.

(21) Appl. No.: 15/784,430

(22) Filed: Oct. 16, 2017

(65) Prior Publication Data

US 2019/0109538 A1  Apr. 11, 2019

Related U.S. Application Data

(60) Provisional application No. 62/572,333, filed on Oct. 13, 2017, provisional application No. 62/568,391, filed on Oct. 5, 2017.

(51) Int. Cl.
| | |
|---|---|
| *H05K 1/18* | (2006.01) |
| *H02M 3/158* | (2006.01) |
| *H05K 1/02* | (2006.01) |

(52) U.S. Cl.
CPC ........ *H02M 3/1584* (2013.01); *H05K 1/0203* (2013.01); *H05K 1/181* (2013.01); *H05K 2201/066* (2013.01); *H05K 2201/1003* (2013.01); *H05K 2201/10015* (2013.01); *H05K 2201/10166* (2013.01); *H05K 2201/10522* (2013.01)

(58) Field of Classification Search
CPC .......... G05F 1/46; G06F 1/26; H01L 29/772; H02M 3/00; H02M 3/156; H02M 3/158; H02M 3/1584; H02M 3/33561
See application file for complete search history.

(56) References Cited

U.S. PATENT DOCUMENTS

| | | | |
|---|---|---|---|
| 2003/0142513 A1* | 7/2003 | Vinciarelli | H02J 1/102 363/17 |
| 2006/0038202 A1* | 2/2006 | Lange | H01L 23/4334 257/222 |
| 2011/0254526 A1* | 10/2011 | Luo | H02M 3/1584 323/284 |
| 2012/0173892 A1* | 7/2012 | Tong | G06F 1/26 713/300 |
| 2014/0306332 A1* | 10/2014 | Denison | H01L 24/34 257/676 |
| 2015/0062989 A1* | 3/2015 | Su | H05K 1/0373 363/123 |

(Continued)

*Primary Examiner* — Yuriy Semenenko
(74) *Attorney, Agent, or Firm* — Okamoto & Benedicto LLP

(57) ABSTRACT

A circuit assembly for a power converter includes power stage blocks. A power stage block includes a power stage IC die, an output inductor that is connected to a switch node of the power stage IC die, and capacitors that form an output capacitor of the power stage block. The output capacitors of the power stage blocks are symmetrically arranged. The output inductors can be placed on the same side of the substrate as the power stage IC dies, or on a side of the substrate that is opposite to the side where the power stage IC dies are disposed. A power stage block may generate two output phases of the power converter.

14 Claims, 10 Drawing Sheets

(56) References Cited

U.S. PATENT DOCUMENTS

| | | | | |
|---|---|---|---|---|
| 2015/0207429 A1* | 7/2015 | Akiyama | ............... | H02M 1/088 363/131 |
| 2017/0229965 A1* | 8/2017 | Parto | ...................... | H02M 3/158 |
| 2017/0331371 A1* | 11/2017 | Parto | ...................... | H02M 3/156 |

* cited by examiner

SYMMETRICAL POWER STAGES FOR HIGH POWER INTEGRATED CIRCUITS

CROSS-REFERENCE TO RELATED APPLICATIONS

This application claims the benefit of U.S. Provisional Application No. 62/572,333, filed on Oct. 13, 2017 and the benefit of U.S. Provisional Application No. 62/568,391, filed on Oct. 5, 2017. The aforementioned related applications are incorporated herein by reference in their entirety.

BACKGROUND OF THE INVENTION

1. Field of the Invention

The present invention relates generally to electrical circuits, and more particularly but not exclusively to circuit assemblies with high power integrated circuits.

2. Description of the Background Art

Power converters are employed to provide a supply voltage to various electrical devices. The output power of a power converter may be increased by adding output phases. Although not usually a problem with discrete circuits, a multiphase power converter in integrated circuit (IC) form may generate excessive heat that may be difficult to dissipate without making compromises to the form factor of the substrate containing the power converter.

SUMMARY

In one embodiment, a circuit assembly for a power converter includes power stage blocks. A power stage block includes a power stage IC die, an output inductor that is connected to a switch node of the power stage IC die, and capacitors that form an output capacitor of the power stage block. The output capacitors of the power stage blocks are symmetrically arranged. The output inductors can be placed on the same side of the substrate as the power stage IC dies, or on a side of the substrate that is opposite to the side where the power stage IC dies are disposed. A power stage block may generate two output phases of the power converter.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

Figure 1:
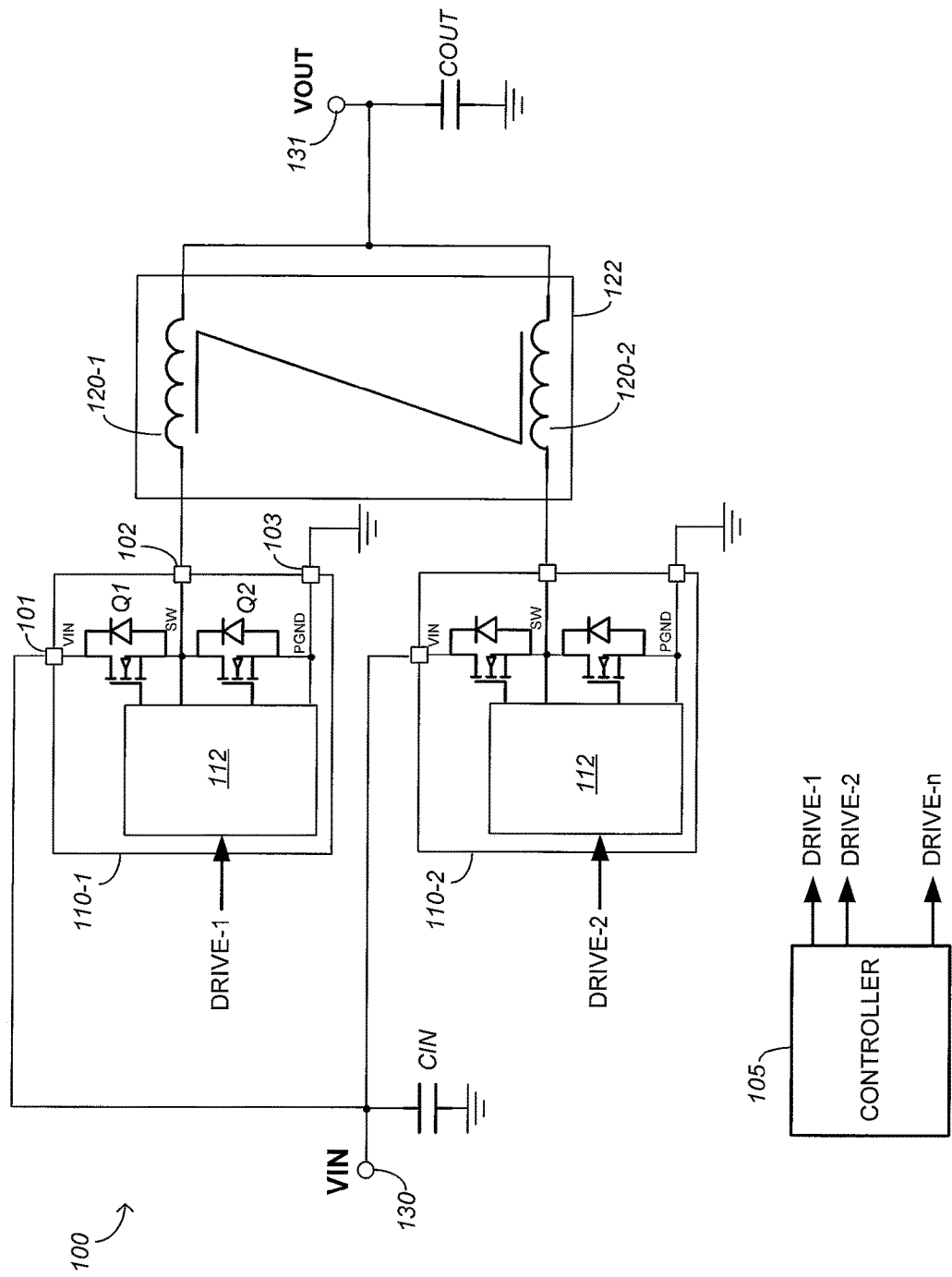
FIG. 1 is a schematic diagram of a power converter in accordance with an embodiment of the present invention.

FIG. 1 is a schematic diagram of a power converter 100 in accordance with an embodiment of the present invention. In the example of FIG. 1, the power converter 100 is a multiphase power converter. The power converter 100 includes a plurality of power stage integrated circuit (IC) dies 110 (110-1, 110-2), one for each output phase. A controller 105 (e.g., PWM controller) generates drive signals DRIVE-1, DRIVE-2, . . . , DRIVE-n, one for each power stage IC die 110, to convert an input voltage VIN to an output voltage VOUT. An input capacitor CIN receives the input voltage VIN at a node 130. The output voltage is developed across an output capacitor COUT at a node 131.

In the example of FIG. 1, the controller 105 is external to the power stage IC dies 110. In other embodiments, a power stage IC die 110 may internally include an integrated controller.

In the example of FIG. 1, a power stage IC die 110 includes a driver circuit 112, a high side switch Q1 (e.g., MOS transistor), and a low side switch Q2 (e.g., MOS transistor). The power stage IC die 110 may include a node 101 for electrically connecting an electrode (e.g., drain) of the high side switch Q1 to the node 130 to receive the input voltage VIN, a node 102 for electrically connecting a switch node SW to a corresponding output inductor 120 (120-1, 120-2), and a node 103 for electrically connecting an electrode (e.g., source) of the low side switch Q2 to a ground reference.

In one embodiment, the output inductors 120-1 and 120-2 are magnetically coupled by a magnetic core 122 in a so-called inductor-coupled topology. In other embodiments, the magnetic core 122 is omitted, and the output inductors 120-1 and 120-2 are conventional output inductors. A first end of an output inductor 120 is electrically connected to a corresponding switch node 102 and a second end of the output inductor 120 is electrically connected to the common output node 131 to provide the output voltage VOUT on the output capacitor COUT.

Figure 2:
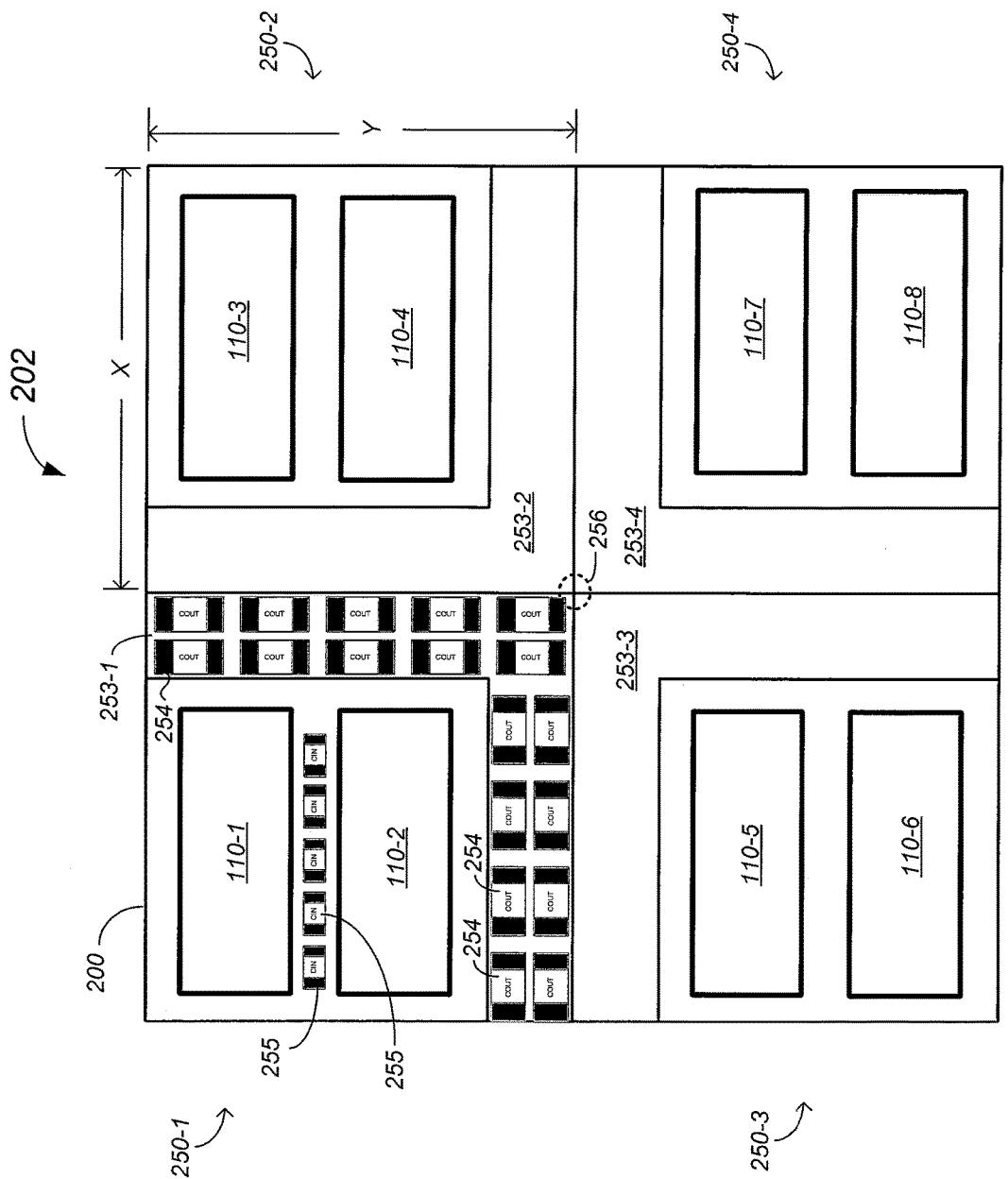
FIG. 2 is a plan view of a circuit assembly of the power converter of FIG. 1 in accordance with an embodiment of the present invention.

FIG. 2 is a plan view of a circuit assembly 202 of the power converter 100 in accordance with an embodiment of the present invention. In the example of FIG. 2, the circuit assembly 202 has a layout that includes a plurality of power stage blocks 250 (250-1, 250-2, 250-3, 250-4) that are formed on a substrate 200. Each power stage block 250 includes two power stage IC dies 110 to provide two output phases per block. Each power stage block 250 may occupy an X by Y area of the substrate 200. In one embodiment, each power stage block 250 is formed on a 10 mm×10 mm area of the substrate 200 and provides two output phases. The circuit assembly 202 may be configured to have a power rating of 500 W, for example.

In the example of FIG. 2, the boundaries of the power stage blocks 250 all meet at a center 256. The power stage blocks 250 are symmetrically arranged for optimum power delivery. The following description of the power stage block 250-1 applies to the other power stage blocks 250.

In the example of FIG. 2, the power stage block 250-1 comprises a plurality of power stage IC dies 110, a plurality of capacitors 254, and a plurality of capacitors 255. The capacitors 255 are electrically connected in parallel to form the input capacitor CIN, and the capacitors 254 are electrically connected in parallel to form the output capacitor COUT. A power stage IC die 110-1 and a power stage IC die 110-2 are mounted on the substrate 200, with the capacitors 255 being mounted on the substrate 200 between the power stage IC dies 110-1 and 110-2. The capacitors 254 are mounted on the substrate 200 in an output capacitor region 253-1.

As shown in FIG. 2, the boundaries of the output capacitor regions 253 (253-1, 253-2, 253-3, 253-4) of the power stage blocks 250 are adjacent to one another. Because the capacitors 254 form the output capacitors COUT, the layout of the output capacitor regions 203 facilitates inter-connection of the output capacitors COUT. In the example of FIG. 2, the circuit assembly 202 includes eight power stage IC dies 110 (110-1, 110-2, . . . , 110-8), thereby providing eight output phases. The output capacitors COUT of the power stage blocks 250 are coupled to the same output node 131 of the power converter 100 to provide an eight-phase output voltage VOUT.

Figure 3:
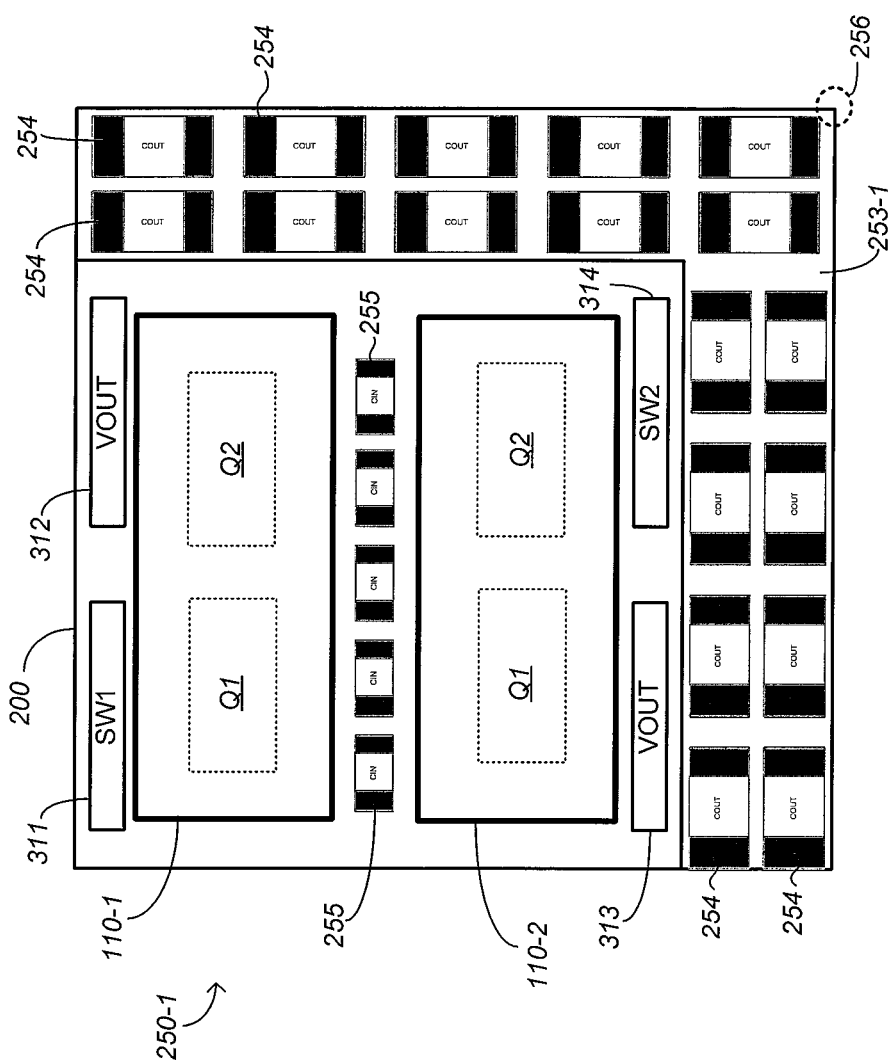
FIG. 3 is a plan view of the circuit assembly of FIG. 2, showing pads of a power stage block, in accordance with an embodiment of the present invention.

FIG. 3 is a plan view of the circuit assembly 202 of the power converter 100, showing pads 311-314 of the power stage block 250-1, in accordance with an embodiment of the present invention. In one embodiment, the pads 311-314 are solder pads on the substrate 200. In the example of FIG. 3, the pad 311 is electrically connected to the switch node SW (see FIG. 1, 102) of the power stage IC die 110-1, and the pad 314 is electrically connected to the switch node SW of the power stage IC die 110-2. The pads 312 and 313 are electrically connected to the common output voltage node (see FIG. 1, 131). The first end of the output inductor 120-1 may be electrically connected to the pad 311 and the second end of the output inductor 120-1 may be electrically connected to the pad 313. Similarly, the first end of the output inductor 120-2 may be electrically connected to the pad 312 and the second end of the output inductor 120-2 may be electrically connected to the pad 314.

Figure 4:
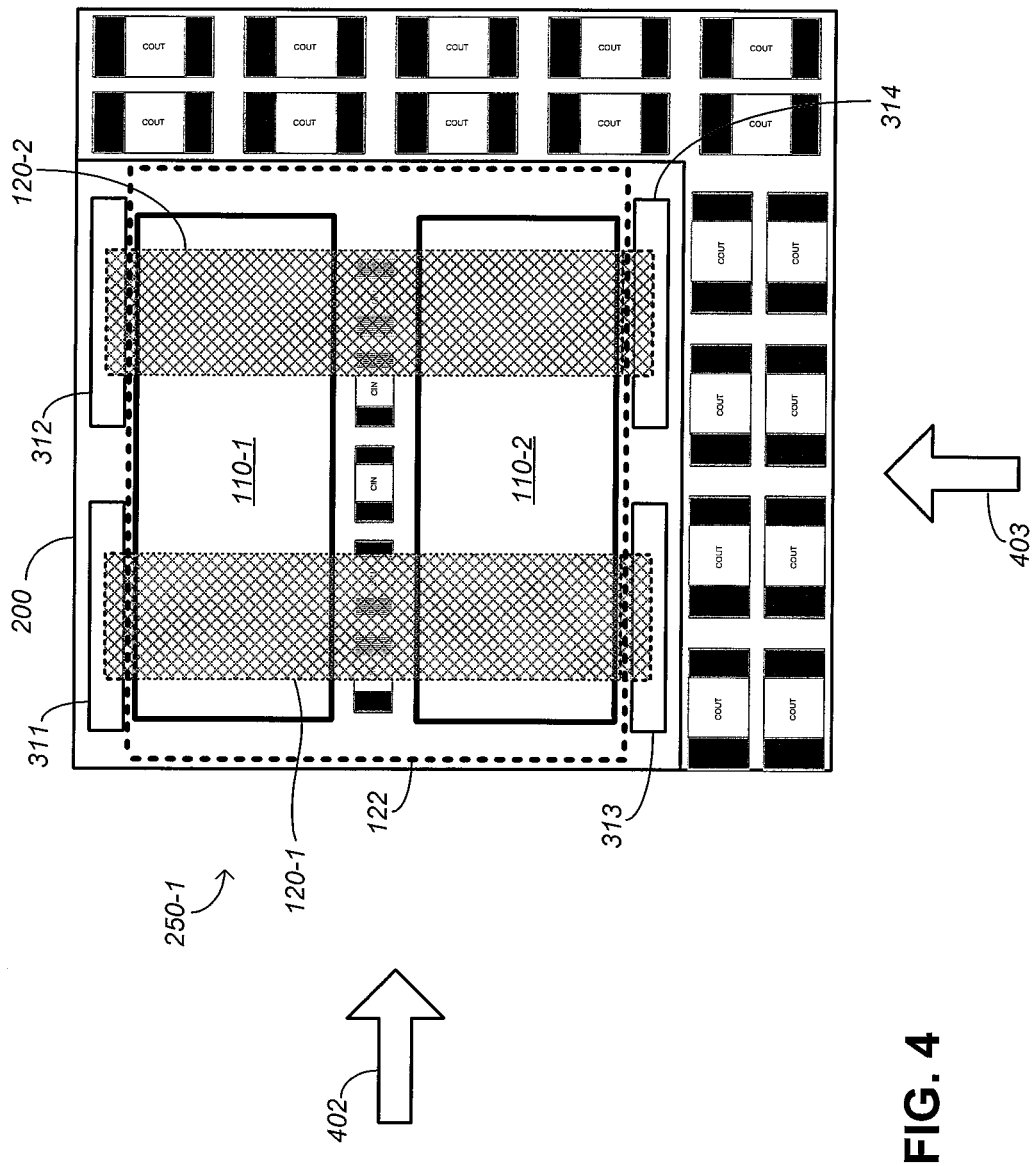
FIG. 4 is a plan view of the circuit assembly of FIG. 2, showing output inductors of a power stage block, in accordance with an embodiment of the present invention.

FIG. 4 is a plan view of the circuit assembly 202 of the power converter 100, showing the output inductors 120 of the power stage block 250-1, in accordance with an embodiment of the present invention. In one embodiment, as later described with reference to FIGS. 5 and 6, the output inductors 120 are mounted on the same side of the substrate 200 as the power stage IC dies 110. In other embodiments, as later described with reference to FIGS. 7 and 8, the power stage IC dies 110 are embedded in the substrate 200. In other embodiments, as later described with reference to FIGS. 9 and 10, the output inductors 120 are mounted on the side of the substrate 200 that is opposite to the side of the substrate 200 where the power stage IC dies 110 are mounted. In general, in light of the present disclosure, the components of the circuit assembly 202 may be in different locations depending on the particular application. Components of the circuit assembly 202 may be electrically connected by way of vias, electrical traces on a surface of the substrate 200, interconnect lines embedded in the substrate 200, etc., without detracting from the merits of the present invention.

In the example of FIG. 4, the first end of the output inductor 120-1 is electrically connected to the pad 311, and the second end of the output inductor 120-1 is electrically connected to the pad 313. Similarly, the first end of the output inductor 120-2 is electrically connected to the pad 312, and the second end of the output inductor 120-2 is electrically connected to the pad 314. An output inductor 120 may be electrically connected to a pad by soldering, for example. The magnetic core 122 is indicated in FIG. 4 as dashed lines.

In the example of FIG. 4, an arrow 402 points to one side of the power stage block 250-1, and an arrow 403 points to another side of the power stage block 250-1. For clarity of illustration, the intervening power stage block 250-3 (see FIG. 2) is not shown in subsequent figures showing the side pointed by the arrow 403.

Figure 5:
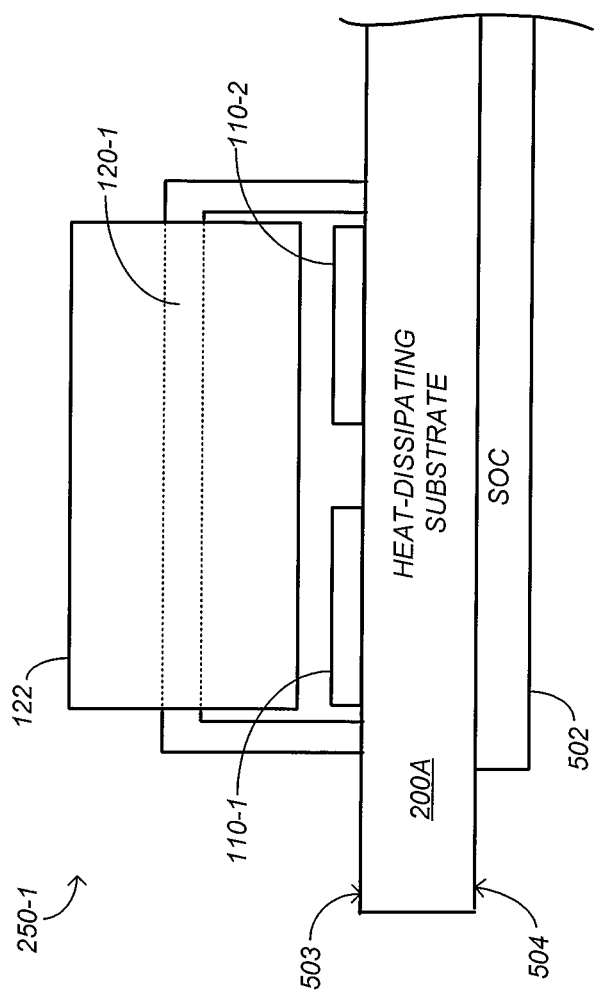
FIGS. 5 and 6 are side views of the circuit assembly of FIG. 4 in accordance with an embodiment of the present invention.
Figure 6:
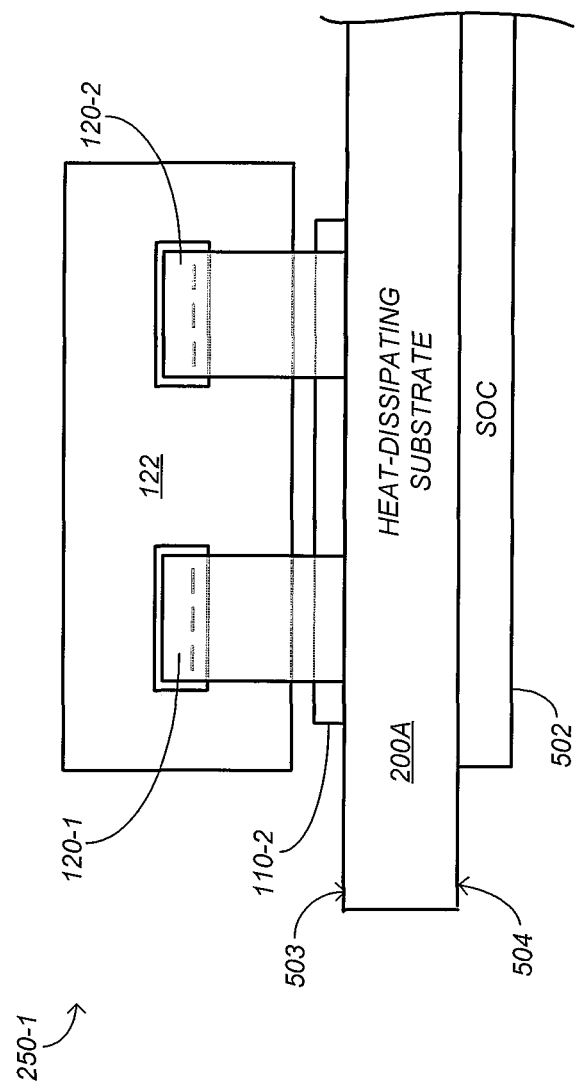

FIGS. 5 and 6 are side views of the circuit assembly 202 of the power converter 100 in accordance with an embodiment of the present invention. FIG. 5 shows the side of the circuit assembly 202 viewed in a direction pointed by the arrow 402, and FIG. 6 shows the side of the circuit assembly 202 viewed in a direction pointed by the arrow 403 (see FIG. 4). In the example of FIGS. 5 and 6, the substrate 200 is relabeled as "200A" to indicate that it is a heat-dissipating substrate, such as a Bismaleimide-Triazine resin substrate. Use of a heat-dissipating substrate advantageously allows heat dissipation without necessarily using a heatsink. The substrate 200A may have embedded copper layers for additional heat dissipation.

In the example of FIG. 5, the substrate 200A has a side 503 and an opposing side 504. The power stage IC dies 110 are mounted on the side 503. The inductors 120 go through the magnetic core 122 and are formed over the power stage IC dies 110 on the side 503. A system on chip (SOC) die 502 is mounted on the side 504. The die 502 may comprise an integrated circuit that is powered by the output of the power converter 100. FIG. 6 shows the side view of the substrate 200A, viewed from the direction pointed by the arrow 403.

Figure 7:
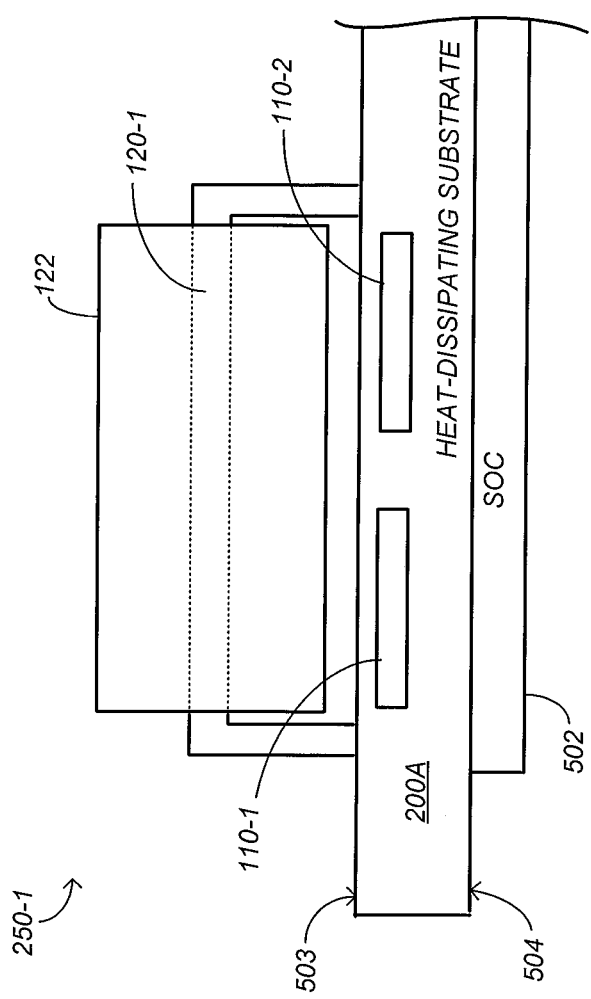
FIGS. 7 and 8 are side views of the circuit assembly of FIG. 4 in accordance with another embodiment of the present invention.
Figure 8:
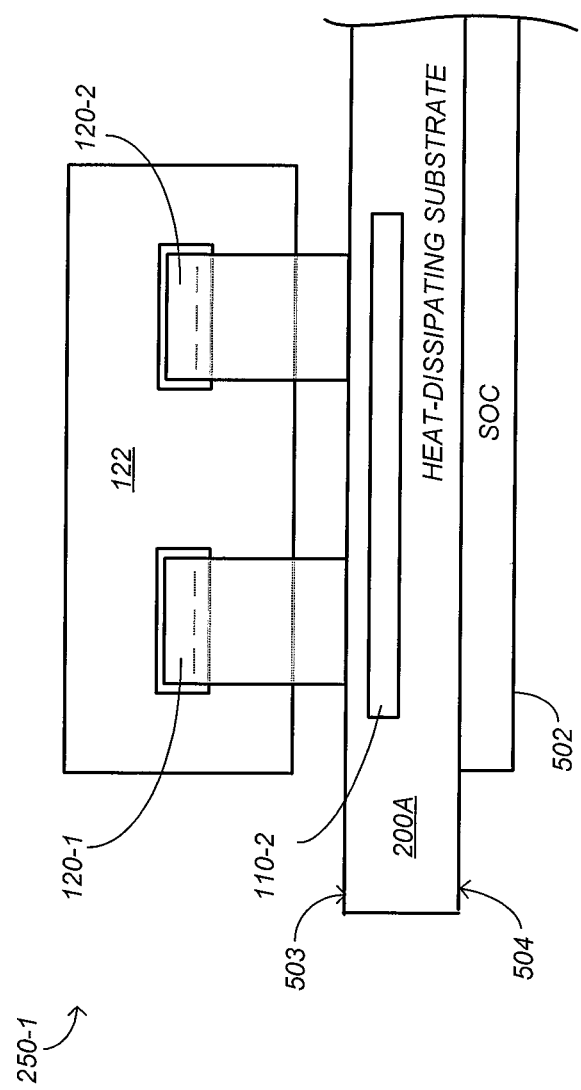

FIGS. 7 and 8 are side views of the circuit assembly 202 of the power converter 100 in accordance with an embodiment of the present invention. FIG. 7 shows the side of the circuit assembly 202 viewed in a direction pointed by the arrow 402, and FIG. 8 shows the side of the circuit assembly 202 viewed in a direction pointed by the arrow 403 (see FIG. 4). The example of FIGS. 7 and 8 are the same as in FIGS. 5 and 6 except that the power stage IC dies 110 are embedded in the substrate 200A.

Figure 9:
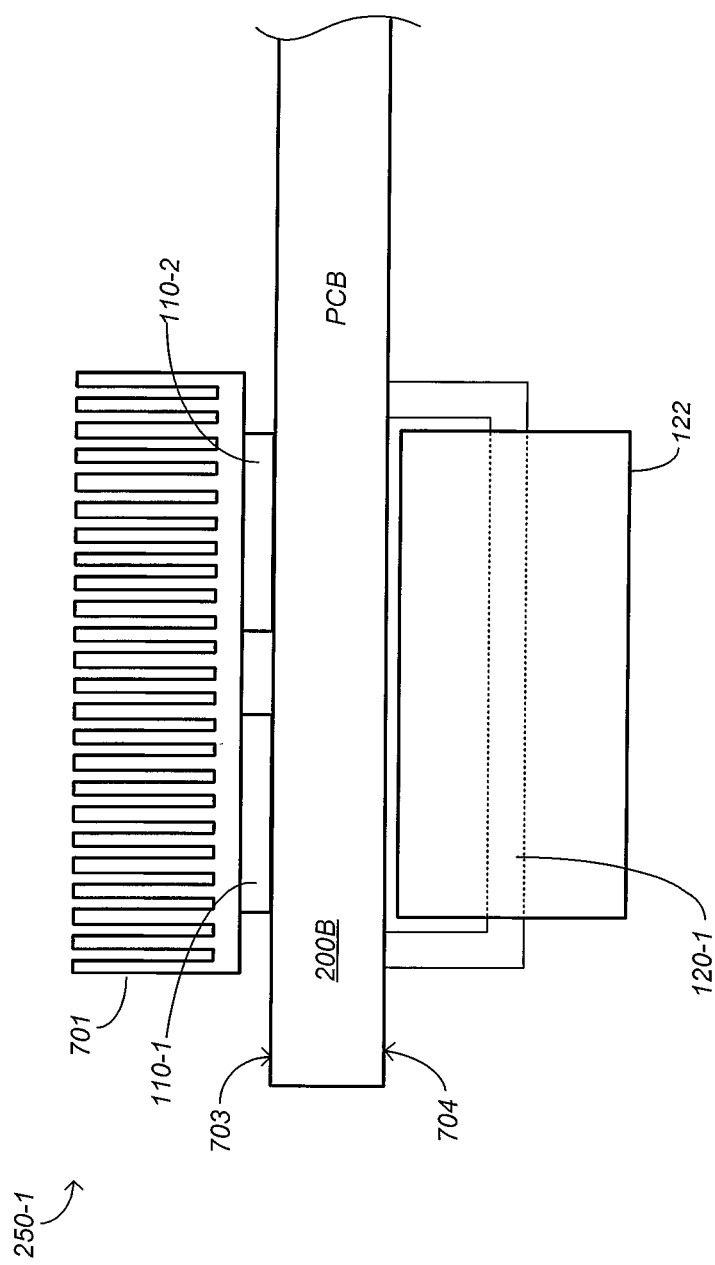
FIGS. 9 and 10 are side views of the circuit assembly of FIG. 4 in accordance with another embodiment of the present invention.
Figure 10:
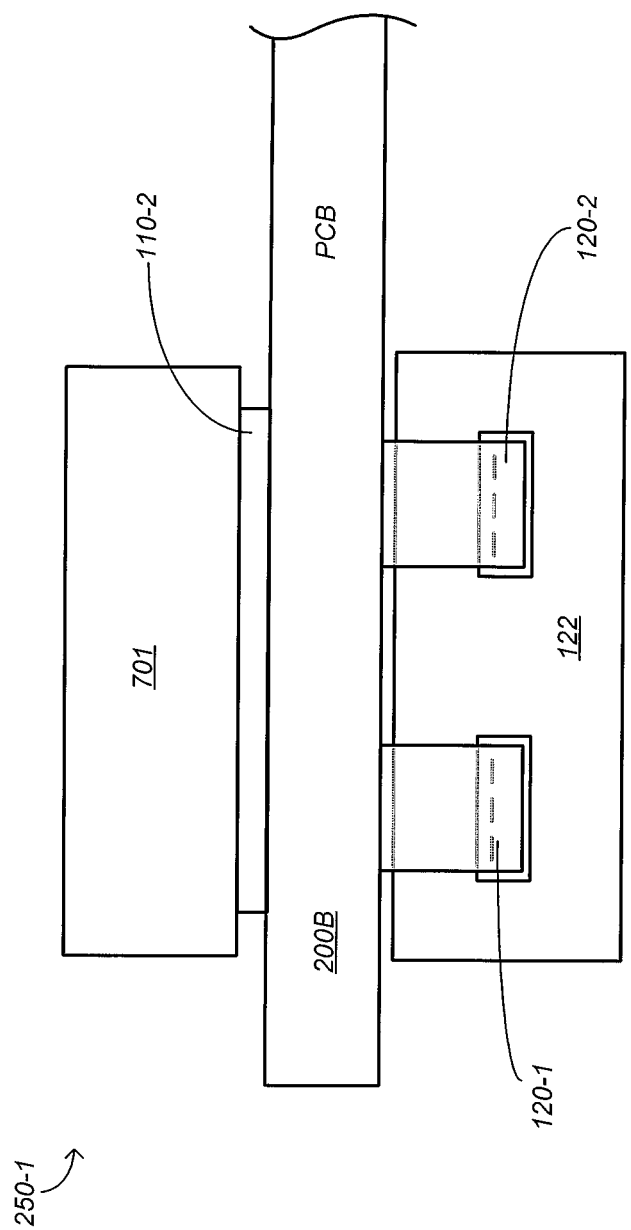

FIGS. 9 and 10 are side views of the circuit assembly 202 of the power converter 100 in accordance with an embodiment of the present invention. FIG. 9 shows the side of the circuit assembly 202 viewed in a direction pointed by the arrow 402, and FIG. 10 shows the side of the circuit assembly 202 viewed in a direction pointed by the arrow 403 (see FIG. 4). In the example of FIGS. 9 and 10, the substrate 200 is relabeled as "200B" to indicate that it is a printed circuit board (PCB).

In the example of FIG. 9, the substrate 200B has a side 703 and an opposing side 704. The power stage IC dies 110 are mounted on the side 703. An optional heatsink 701 may be attached to the power stage IC dies 110 for heat dissipation. The inductors 120 go through the magnetic core 122 and are mounted on the side 704. An SOC die or other integrated circuit (not shown) that receives power from the power converter 100 may be mounted on either side of the substrate 200B. FIG. 10 shows the side view of the substrate 200B, viewed from the direction pointed by the arrow 403.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A circuit assembly of a power converter, the circuit assembly comprising:
   a substrate;
   a first power stage integrated circuit (IC) die comprising a first transistor and a second transistor, a terminal of the first transistor of the first power stage IC die and a terminal of the second transistor of the first power stage IC die being coupled to a switch node of the first power stage IC die;
   a second power stage IC die comprising a first transistor and a second transistor, a terminal of the first transistor of the second power stage IC die and a terminal of the second transistor of the second power stage IC die being coupled to a switch node of the second power stage IC die;
   a first output inductor having a first end that is coupled to the switch node of the first power stage IC die and a second end that is coupled to an output node of the power converter, the first output inductor being disposed over the first power stage IC die and over the second power stage IC die;
   a second output inductor having a first end that is coupled to the switch node of the second power stage IC die and a second end that is coupled to the second end of the first output inductor, the second output inductor being disposed over the first power stage IC die and over the second power stage IC die; and
   a first magnetic core that is disposed over the first power stage IC die and over the second power stage IC die, the first magnetic core being configured to magnetically couple the first output inductor and the second output inductor, wherein the first and second output inductors are disposed through the first magnetic core.

2. The circuit assembly of claim 1, further comprising:
   a third power stage IC die;
   a fourth power stage IC die;
   a third output inductor having a first end that is coupled to a switch node of the third power stage IC die and a second end that is coupled to the output node of the power converter, the third output inductor being disposed over the third power stage IC die and over the fourth power stage IC die;
   a fourth output inductor having a first end that is coupled to a switch node of the fourth power stage IC die and a second end that is coupled to the second end of the third output inductor, the fourth output inductor being disposed over the third power stage IC die and over the fourth power stage IC die; and
   a second magnetic core through which the third and fourth output inductors are disposed, the second magnetic core being disposed over the third power stage IC die and over the fourth power stage IC die.

3. The circuit assembly of claim 1, wherein the substrate is a printed circuit board.

4. The circuit assembly of claim 1, wherein the first power stage IC die and the second power stage IC die are disposed on a first side of the substrate, and the circuit assembly further comprises an integrated circuit die that is disposed on a second side of the substrate, the first side being opposite the second side.

5. The circuit assembly of claim 4, wherein power to the integrated circuit die is from the power converter.

6. The circuit assembly of claim 1, wherein the substrate is a printed circuit board (PCB), the first power stage IC die and the second power stage IC die are disposed on a first side of the PCB, and the circuit assembly further comprises an integrated circuit die that is disposed on a second side of the PCB, the first side being opposite the second side.

7. The circuit assembly of claim 2, further comprising:
   a first power stage block disposed on the substrate, the first power stage block comprising the first power stage IC die and the second power stage IC die;
   a second power stage block disposed on the substrate, the second power stage block comprising the third power stage IC die and the fourth power stage IC die;
   a third power stage block disposed on the substrate; and
   a fourth power stage block disposed on the substrate,
   wherein the first, second, third, and fourth power stage blocks have rectangular boundaries and are symmetrically arranged on the substrate about orthogonal lines that intersect at a center point where corners of the boundaries of the first, second, third, and fourth power stage blocks meet.

8. A circuit assembly of a multiphase power converter, the circuit assembly comprising:
   a substrate;
   a plurality of power stage blocks disposed on the substrate, each of the power stage blocks being configured to generate at least one phase of the multiphase power converter and has a rectangular boundary;
   a plurality of output inductors, each of the output inductors being coupled to a switch node of a power stage integrated circuit (IC) die of a corresponding power stage block; and
   a plurality of output capacitors that are coupled to an output node of the multiphase power converter, the output capacitors being arranged around a same region on a surface of the substrate,
   wherein the plurality of power stage blocks are symmetrically arranged on the surface of the substrate and about orthogonal lines that intersect at a center point where corners of boundaries of the plurality of power stage blocks meet.

9. The circuit assembly of claim 8, wherein the substrate comprises a printed circuit board (PCB).

10. The circuit assembly of claim 9, wherein the output inductors are on a first side of the PCB, and power stage integrated circuit dies of the circuit assembly are on a second side of the PCB, the first side being opposite the second side.

11. The circuit assembly of claim 10, further comprising a plurality of heatsinks attached to the power stage integrated circuit dies on the second side of the PCB.

12. The circuit assembly of claim 8, wherein the output inductors are on a same side of the substrate as power stage integrated circuit dies of the circuit assembly.

13. The circuit assembly of claim 8, wherein power stage integrated circuit dies of the circuit assembly are embedded in the substrate.

14. The circuit assembly of claim 8, wherein the multiphase power converter has eight output phases, and each power stage block delivers two output phases.

* * * * *